United States Patent
Hsieh (10) Patent No.: US 8,653,589 B2
(45) Date of Patent: Feb. 18, 2014

(54) LOW QGD TRENCH MOSFET INTEGRATED WITH SCHOTTKY RECTIFIER

(75) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 434 days.

(21) Appl. No.: 13/196,324

(22) Filed: Aug. 2, 2011

(65) Prior Publication Data

US 2011/0284954 A1 Nov. 24, 2011

Related U.S. Application Data

(63) Continuation-in-part of application No. 12/385,638, filed on Apr. 15, 2009, now abandoned.

(51) Int. Cl.
*H01L 29/78* (2006.01)

(52) U.S. Cl.
USPC ............... 257/331; 257/476; 257/E29.265

(58) Field of Classification Search
None
See application file for complete search history.

(56) References Cited

U.S. PATENT DOCUMENTS

2006/0209887 A1* 9/2006 Bhalla et al. .................. 370/466
2008/0277694 A1* 11/2008 Hossain et al. ............... 257/213

* cited by examiner

*Primary Examiner* — Wensing Kuo
(74) *Attorney, Agent, or Firm* — Bacon & Thomas, PLLC (57) ABSTRACT

An integrated circuit includes a plurality of trench MOSFET and a plurality of trench Schottky rectifier. The integrated circuit further comprises: tilt-angle implanted body dopant regions surrounding a lower portion of all trenched gates sidewalls for reducing Qgd; a source dopant region disposed below trench bottoms of all trenched gates for functioning as a current path for preventing a resistance increased caused by the tilt-angle implanted body dopant regions.

9 Claims, 11 Drawing Sheets

LOW QGD TRENCH MOSFET INTEGRATED WITH SCHOTTKY RECTIFIER

CROSS REFERENCE TO RELATED APPLICATIONS

This application is a continuation-in-part (CIP) of U.S. patent application Ser. No. 12/385,638, filed on Apr. 15, 2009.

BACKGROUND OF THE INVENTION

1. Field of the Invention

This invention relates generally to integrated circuits comprising trench MOSFETs (Metal Oxide Semiconductor Field Effect Transistors) in parallel with trench Schottky rectifiers. More particularly, this invention relates to a novel and improved structure process of fabricating a circuit with integrated trench MOSFETs and trench Schottky rectifiers with a low Qgd (coupling charge between gate and drain).

2. The Prior Arts

The Schottky rectifiers have been used in DC-DC converters. In parallel with a parasitic PN body diode, the Schottky rectifier acts as a clamping diode to prevent the PN body diode from turning on for the reason of higher speed and efficiency, so the recent interests have been focused on the technology to integrate a trench MOSFET and the Schottky rectifier on a single semiconductor substrate. In U.S. Pat. Nos. 6,351,018 and 6,593,620 of prior art, configurations of forming the Schottky rectifier on the same semiconductor substrate with the trench MOSFET are disclosed, as shown in FIG. 1 and FIG. 2, respectively.

Figure 1:
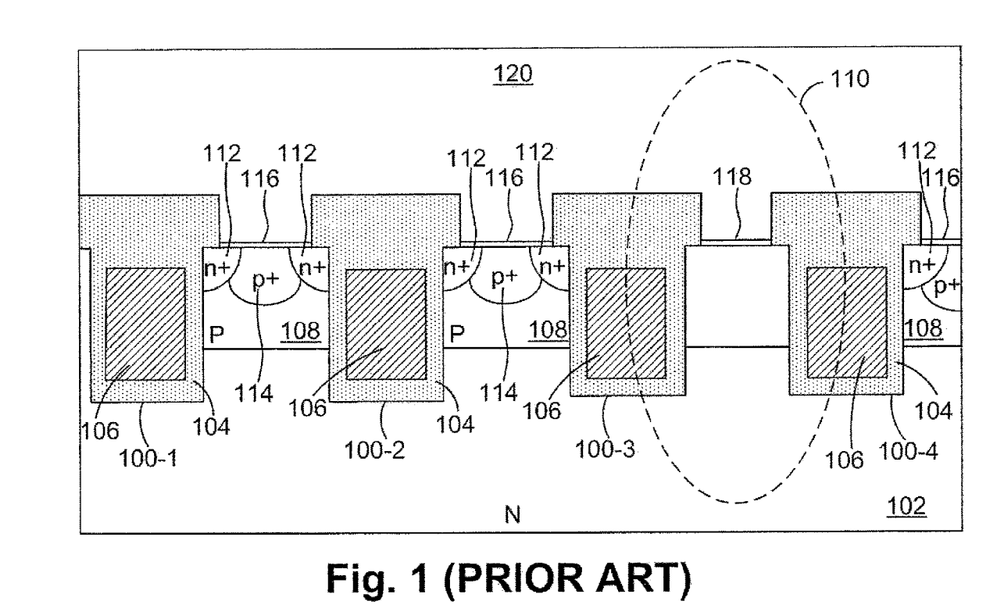
FIG. 1 is a side cross-sectional view of an integrated trench MOSFET and Schottky rectifier of prior art.

In FIG. 1, an integrated trench MOSFET-Schottky rectifier structure is fabricated on an N substrate 102, into which a plurality of gate trenches 100-1, 100-2, 100-3 and 100-4 are etched. An insulation layer 104 lines inner surface of all the gate trenches as a gate oxide, onto which a conductive material 106 is formed to act as gate material. A plurality of P body regions 108 are formed between every two adjacent of the gate trenches except between those where the Schottky rectifier will be formed (the gate trench 100-3 and 100-4, as illustrated). Near top surface of the P body region 108, a plurality of n+ source regions 112 are formed followed by formation of p+ body contact region 114 between a pair of the n+ source regions 112 in the P body regions 108. In order to distinguish conductive layers onto the N substrate 102 playing different roles, 116 is marked to figure those conductive layers being connected to the n+ source regions while 118 figures an anode of the Schottky rectifier 110 as circled by dotted line. A metal layer 120 is formed to contact both the n+ source regions 112 of the trench MOSFET and the anode of the Schottky rectifier 110.

Figure 2:
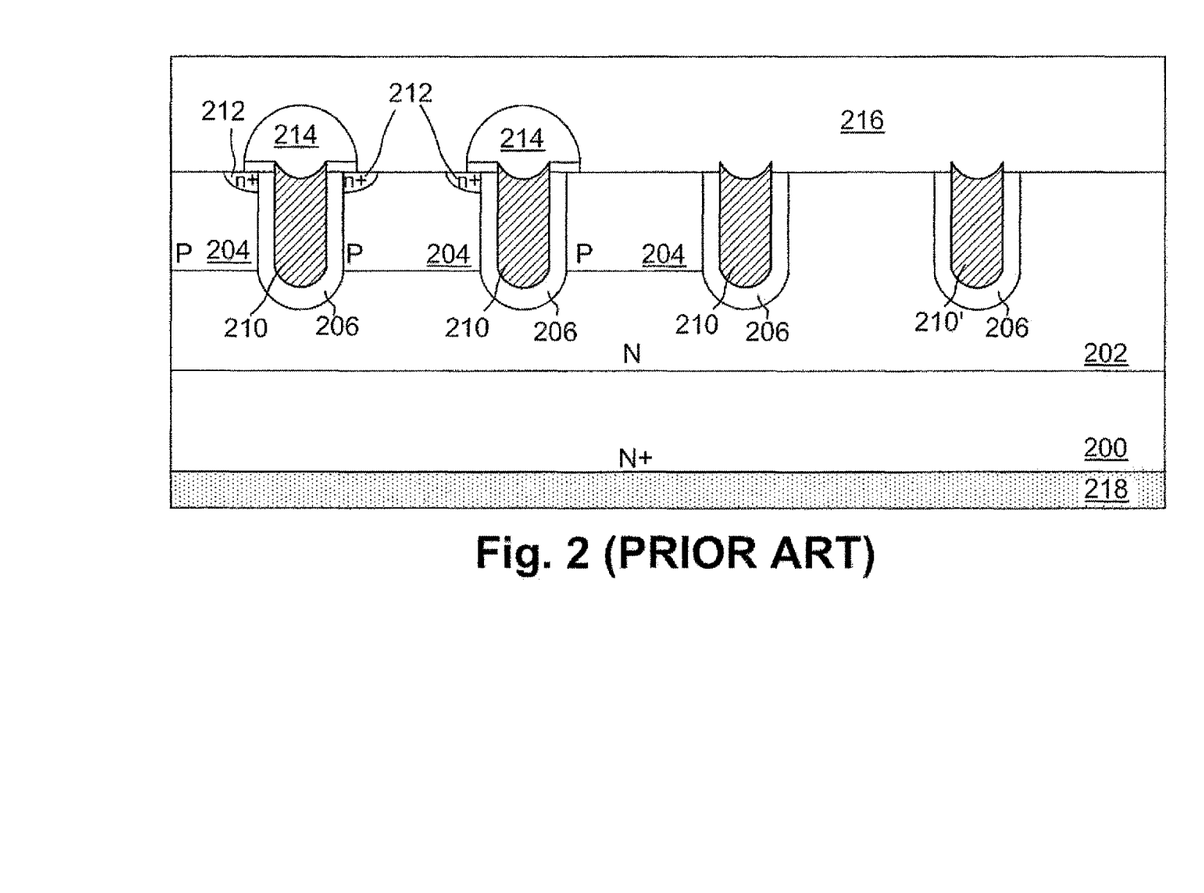
FIG. 2 is a side cross-sectional view of another integrated trench MOSFET and Schottky rectifier of prior art.

In FIG. 2, another integrated structure illustrated was formed in an epitaxial layer 202 formed onto an N+ substrate 200 coated with a back metal 218 on a rear side of the N+ substrate 200 as a drain metal for the trench MOSFET simultaneously as a cathode metal for the Schottky rectifier. The trench MOSFET further comprises: a plurality of gate trenches are formed lined by a gate oxide 206 and filled with a conductive material 210 to serve as trenched gates which were insulated from a front metal 216 by a BPSG layer 214; a plurality of n+ source regions 212 encompassed in P body regions 204 surrounding the trenched gates. Compared to the structure in FIG. 1, the Schottky rectifier in FIG. 2 had a separated trenched gate formed with the conductive material 210' which was contacting with the front metal 216 to be shorted to the n+ source regions 212 and the P body regions 204 of the trench MOSFET.

Both integrated configurations of prior art illustrated in FIG. 1 and FIG. 2 can achieve the integration of the trench MOSFET and the Schottky rectifier on a single semiconductor substrate, however, there are still some disadvantages affecting the performance of prior arts.

First of all, in order to further increase switching speed of a trench MOSFET, it is desirable to reduce Qgd (coupling charges between gate and drain of a trench MOSFET) such that a reduction of Crss (capacitance between gate and drain of a trench MOSFET) can be achieved. However, the configurations as shown in FIG. 1 and FIG. 2 each has a large amount of Qgd between gate and drain due to direct coupling between trench bottoms and portion of trench sidewalls of the trenched gates and the epitaxial layer.

Another disadvantage of the prior art is that, the Schottky rectifier is formed by using planar contact structure which occupies a large area, almost one time of the trench MOSFET. As the size of a semiconductor power device is developed to be reduced, the planar contact structure should be replaced by another improved contact structure which will meet the need for size requirement. On the other hand, the planar contact structure will lead to a device shrinkage limitation, resulting in high specific on-resistance according to the length dependence of a resistance.

Furthermore, during fabricating process, an additional p+ body contact region mask is required for the Schottky rectifier of prior art, therefore increasing the fabricating cost.

Accordingly, it would be desirable to provide an integrated circuit comprising a trench MOSFET and a Schottky rectifier, and having lower Qgd, lower on-resistance, as well as device shrinkage capability with lower fabricating cost.

SUMMARY OF THE INVENTION

It is therefore an object of the present invention to provide a novel integrated circuit comprising a trench MOSFET and a Schottky rectifier, and an improved fabricating method solving the problems mentioned above.

One advantage of the present invention is that, a plurality of tilt-angle implanted body dopant region of a second conductivity doping type, e.g. P dopant, marked by p* regions as shown in FIG. 3 to 6, are formed in an N-channel integrated circuit, surrounding lower portions of trenched gates sidewalls to decouple the trenched gates from a drain such that Qgd can be reduced. Furthermore, a plurality of source dopant regions of a first conductivity doping type, e.g. N dopant, marked by n* regions as shown in FIG. 3 to FIG. 6, are formed below trench bottoms of the trenched gates and adjacent to the p* tilt-angle implanted body dopant regions to provide a current path between the drain to a source region such that the p* tilt-angle implanted body dopant regions will not inadvertently increase the resistance between the drain and the source region but Crss can be significantly reduced to a value that is about half or even lower when compared with Crss of prior art because Crss and Qgd will be mainly determined by trench width in the present invention when compared with the prior arts in FIG. 1 and FIG. 2.

Another advantage of the present invention is that, both the trench MOSFET and the Schottky rectifier are employing trenched contact structure instead of the planar contact structure of prior arts. By employing the trenched contact structure, the integrated circuit is able to shrink to achieve a lower specific on-resistance for the trench MOSFET, and achieve a lower Vf (forward voltage) and lower Ir (reverse leakage current) for the Schottky rectifier.

Another advantage of the present invention is that, the Schottky rectifier is formed having a Schottky silicide barrier layer along at least trench sidewalls of the trenched contact for the Schottky rectifier, therefore the Schottky rectifier is implemented as trench Schottky rectifier.

Another advantage of the present invention is that, there is no need to apply an additional body contact region mask for the trench Schottky rectifier in fabricating process, therefore cost saving is achieved.

Briefly, in a preferred embodiment, the present invention disclosed an integrated circuit formed on a heavily doped semiconductor substrate of a first conductivity doping type comprising a trench MOSFET and a trench Schottky rectifier. The trench MOSFET formed in an epitaxial layer of the first conductivity doping type onto semiconductor substrate further comprises: a plurality of first type trenched gates filled with a doped poly-silicon layer above a layer of gate oxide and surrounded by source regions of the first conductivity doping type encompassed in body regions of a second conductivity doping type above a drain region disposed on a bottom surface of the semiconductor substrate; a plurality of tilt-angle implanted body dopant regions of the second conductivity doping type surrounding lower portions of trench sidewalls of the first type trenched gates to further reduce Qgd, wherein the tilt-angle implanted body dopant regions have a same conductivity doping type as the body regions and have a opposite conductivity doping type to the semiconductor substrate; a plurality of source dopant regions of the same conductivity doping type as the semiconductor substrate right below trench bottoms of the first type trenched gates and adjacent to the tilt-angle implanted body dopant regions for functioning as a current path between the drain region to the source regions for preventing a resistance increase caused by the tilt-angle implanted body dopant regions; a source-body contact trench penetrating through a thick oxide layer and filled contact metal plug padded by a barrier layer to connect all the source regions to a source metal padded by a resistance-reduction layer deposited onto the thick oxide layer; a body contact region underneath bottom of the source-body contact trench to further reduce contact resistance between the body regions and the contact metal plug. The trench Schottky rectifier further comprises: a plurality of second type trenched gate filled with the doped poly-silicon layer and penetrating into the epitaxial layer; the tilt-angle implanted body dopant regions surrounding trench sidewalls of the second type trenched gates; the source dopant regions right below trench bottoms of the second type trenched gates and adjacent to the tilt-angle implanted body dopant regions; a plurality of Schottky contact trenches filled with the contact metal plugs padded by the barrier metal layer; a Schottky silicide barrier layer formed at least along trench sidewalls of the Schottky contact trenches in the epitaxial layer; the contact metal plugs filled into the Schottky contact trenches as anode material for the trench Schottky rectifier and connected to an anode metal layer which is the same metal layer as the source metal for the trench MOSFET. In some preferred embodiment, the body contact regions are formed underneath trench bottoms of the Schottky contact trenches in the epitaxial layer, while in other preferred embodiment, there is no the body contact regions underneath trench bottoms of the Schottky contact trenches and the Schottky silicide barrier layer lines trench sidewalls and trench bottoms of the Schottky contact trenches. What should be noticed is that, the integrated circuit has a single gate oxide and the second type trenched gates in the trench Schottky rectifier are not connected with the first type trenched gates in the trench MOSFET but shorted with the anode metal of the trench Schottky rectifier.

Briefly, in another embodiment, the present invention disclosed an integrated circuit formed on a heavily doped semiconductor substrate of a first conductivity doping type, comprising a trench MOSFET and a trench Schottky rectifier and in parallel with a trenched gate for gate connection of both the trench MOSFET and the trench Schottky. The trench MOSFET formed in an epitaxial layer of the first conductivity doping type onto the semiconductor substrate further comprises: a plurality of first type trenched gates filled with a doped poly-silicon layer onto a layer of gate oxide and surrounded by source regions of the first conductivity doping type encompassed in body regions of a second conductivity doping type above a drain region disposed on a bottom surface of the semiconductor substrate; a plurality of tilt-angle implanted body dopant regions of the second conductivity doping type surrounding lower portions of trench sidewalls of the first type trenched gates to further reduce Qgd, wherein the tilt-angle implanted body dopant regions have a same conductivity doping type as the body regions and have a opposite conductivity doping type to the semiconductor substrate; a plurality of source dopant regions of the same conductivity doping type as the semiconductor substrate right below trench bottoms of the first type trenched gates and adjacent to the tilt-angle implanted body dopant regions for functioning as a current path between the drain region to the source regions for preventing a resistance increase caused by the tilt-angle implanted body dopant regions; a source-body contact trench penetrating through a thick oxide layer and filled with contact metal plug padded by a barrier metal layer to connect the source regions and the body regions to a source metal padded by a resistance-reduction layer deposited onto the thick oxide layer; a body contact region underneath each bottom of the source-body contact trench to further reduce contact resistance between the body regions and the contact metal plug. The trench Schottky rectifier further comprises: a plurality of second type trenched gates filled with the doped poly-silicon layer and penetrating into the epitaxial layer; the tile-angle implanted body dopant regions surrounding trench sidewalls of the second type trenched gates; the source dopant regions right below trench bottoms of the second type trenched gates and adjacent to the tilt-angle implanted body dopant regions; a plurality of Schottky contact trenches filled with the contact metal plugs padded by the barrier metal layer; the contact metal plugs filled into the Schottky contact trenches as anode material for the trench Schottky rectifier and connected to an anode metal layer which is the same metal layer as the source metal for the trench MOSFET. In some preferred embodiment, the body contact regions are formed underneath trench bottoms of the Schottky contact trenches in the epitaxial layer, while in other preferred embodiment, there is no the body contact regions underneath trench bottoms of the Schottky contact trenches and the Schottky silicide barrier layer lines trench sidewalls and trench bottoms of the Schottky contact trenches. What should be noticed is that, the second type trenched gates in the trench Schottky rectifier are not shorted with the anode metal but with the first type trenched gates in the trench MOSFET through a common trenched gate for gate connection.

In an N-channel integrated circuit, the first conductivity doping type is N type while the second conductivity doping type is P type. In a P-channel integrated circuit, the first conductivity doping type is P type while the second conductivity doping type is N type.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 3:
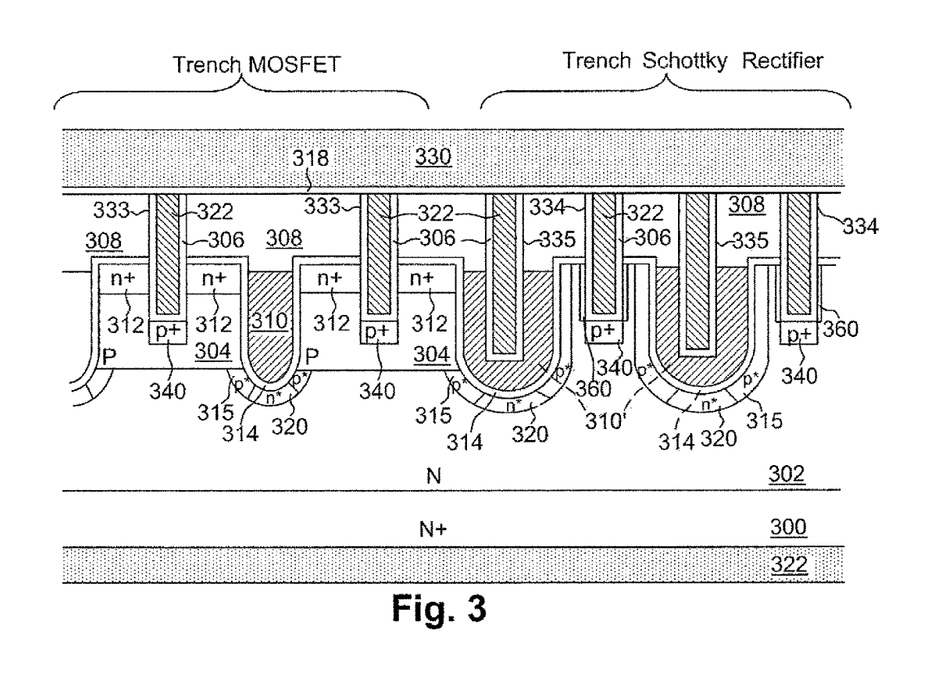
FIG. 3 is a side cross-sectional view of a preferred embodiment in accordance with the present invention.

Please refer to FIG. 3 for a preferred embodiment of the present invention where an N-channel integrated circuit comprising a trench MOSFET and a trench Schottky rectifier is formed on a heavily N+ doped semiconductor substrate 300 with back metal 322 on rear side as a drain. Onto the N+ semiconductor substrate 300, an N epitaxial layer 302 is grown with a same conductivity doping type as the N+ semiconductor substrate 300 and a lower doping concentration. The inventive integrated circuit further comprises a plurality of first type trenched gates 310 for the trench MOSFET and a plurality of second type trenched gates 310' for the trench Schottky rectifier, wherein the first type trenched gates 310 and the second type trenched gates 310' are filled with a doped poly-silicon layer padded by a single gate oxide layer 314, wherein the second type trenched gates 310' have a greater trench width than the first type trenched gates 310. A plurality of P body regions 304 surround trench sidewalls of the first type trenched gates 310 on upper portion of the N epitaxial layer 302. The P body regions 304 further encompass n+ source regions 312 formed near top surface of the N epitaxial layer 302. An insulating layer 308 implemented by using a thick oxide layer covers the top surface of the N epitaxial layer. In the trench MOSFET, source-body contact trenches 333 filled with contact metal plugs 322 padded by a barrier metal layer 306 is penetrating through the insulating layer 308, the n+ source regions 312 and extending into the P body regions 304 wherein the contact metal plugs 322 are implemented by using tungsten material and the barrier metal layer 306 is Ti/TiN or Co/TiN. In the trench Schottky rectifier, a plurality of Schottky contact trenches 334 filled with the contact metal plugs 322 padded by the barrier metal layer 306 are penetrating through the insulating layer 308 and extending into the N epitaxial layer 302. Besides, a plurality of gate contact trenches 335 filled with the contact metal plugs 322 padded by the barrier metal layer 306 are formed penetrating through the insulating layer 308 and extending into the doped poly-silicon layer filled in the second type trenched gates 310'. Right below each the source-body contact trench 333 and each the Schottky contact trench 334, a p+ body contact region 340 is formed to reduce the resistance between the contact metal plugs 322 and the P body regions 304 to allow a low-resistance contact for the trench MOSFET. In the trench Schottky rectifier, the Schottky contact trenches 334 are used to form Schottky diodes by forming a Schottky silicide barrier layer 360 along trench sidewalls of each the Schottky contact trench 334 in the N epitaxial layer 302, separated from the adjacent second type trenched gates 310' by the N epitaxial layer 302. Above the insulating layer 308, a source/anode metal layer 330 composed of Al alloys or Copper coated with a resistance-reduction layer 318 composed of Ti or Ti/TiN is deposited to be electrically connected to the n+ source regions 312 and the P body regions 304 of the trench MOSFET as a source metal while functioning as an anode metal for the trench Schottky rectifier. Especially, the second type trenched gates 310' in the trench Schottky rectifier is not connected with the first type trenched gates 310 in the trench MOSFET but shorted with the anode metal of the trench Schottky rectifier via the contact metal plugs 322 filled into the gate contact trenches 335.

For the purpose of reducing Qgd, trench sidewalls of the second type trenched gates 310' for the trench Schottky rectifier and bottom portion of trench sidewalls of the first type trenched gates 310 for the trench MOSFET are surrounded by p* tilt-angle implanted body dopant regions 315, as illustrated in FIG. 3. Furthermore, central portions underneath trench bottoms of the first type trenched gates 310 and the second type trenched gates 310' are surrounded by n* source dopant regions 320, as illustrated in FIG. 3. Therefore, Qgd is reduced with the p* tilt-angle implanted body dopant regions 315 while the n* source dopant regions 320 under the trench bottoms providing a current path of the drain to the source regions thus preventing the inadvertent increase of the on-resistance. Furthermore, by reducing Qgd, Crss may be reduced to half of the original capacitance or even lower compared to the capacitance of the prior arts. The Schottky silicide barrier layers 360 formed along the trench sidewalls of the Schottky contact trenches 334 in the N epitaxial layer 302 is separated from the adjacent second type trenched gates 310' by the N epitaxial layer 302, the p* tilt-angle implanted body dopant regions 315 and the gate oxide 314 without having the n+ source regions 312 and the P body regions 304 between the adjacent second type trenched gates 310'.

Figure 4:
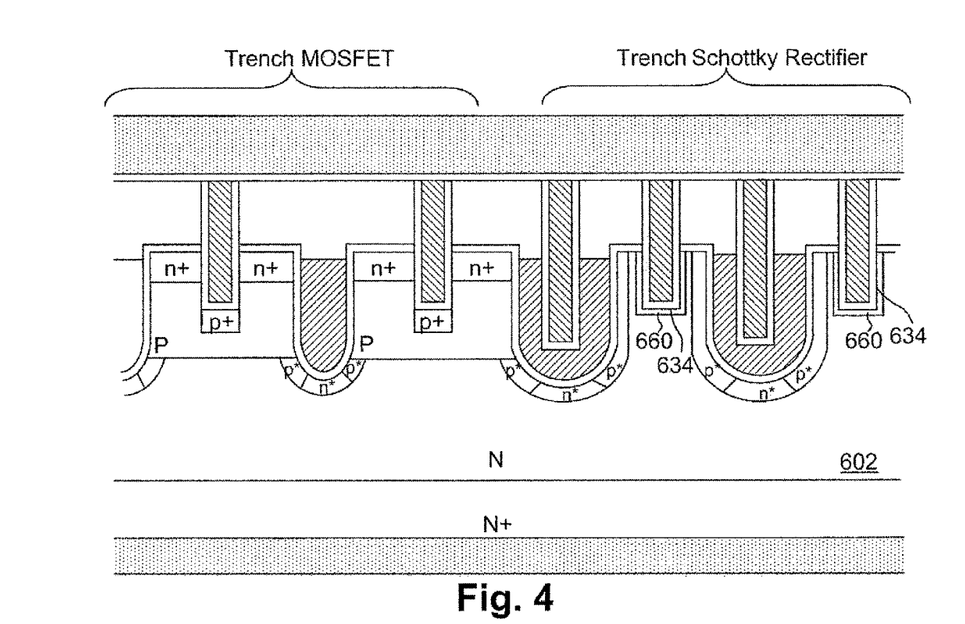
FIG. 4 is a side cross-sectional view of another preferred embodiment in accordance with the present invention.

FIG. 4 shows a side cross sectional view of another preferred embodiment of the present invention with a similar configuration to that of the integrated circuit in FIG. 3 except that, there is no the p+ body contact regions underneath the Schottky contact trenches 634 for the trench Schottky rectifier, which is implemented by using an additional mask to block p+ Ion Implantation during fabricating process. The trench Schottky rectifier has the Schottky silicide barrier layer 660 formed along the trench sidewalls and trench bottoms of the Schottky contact trenches in the N epitaxial layer 602.

Figure 5:
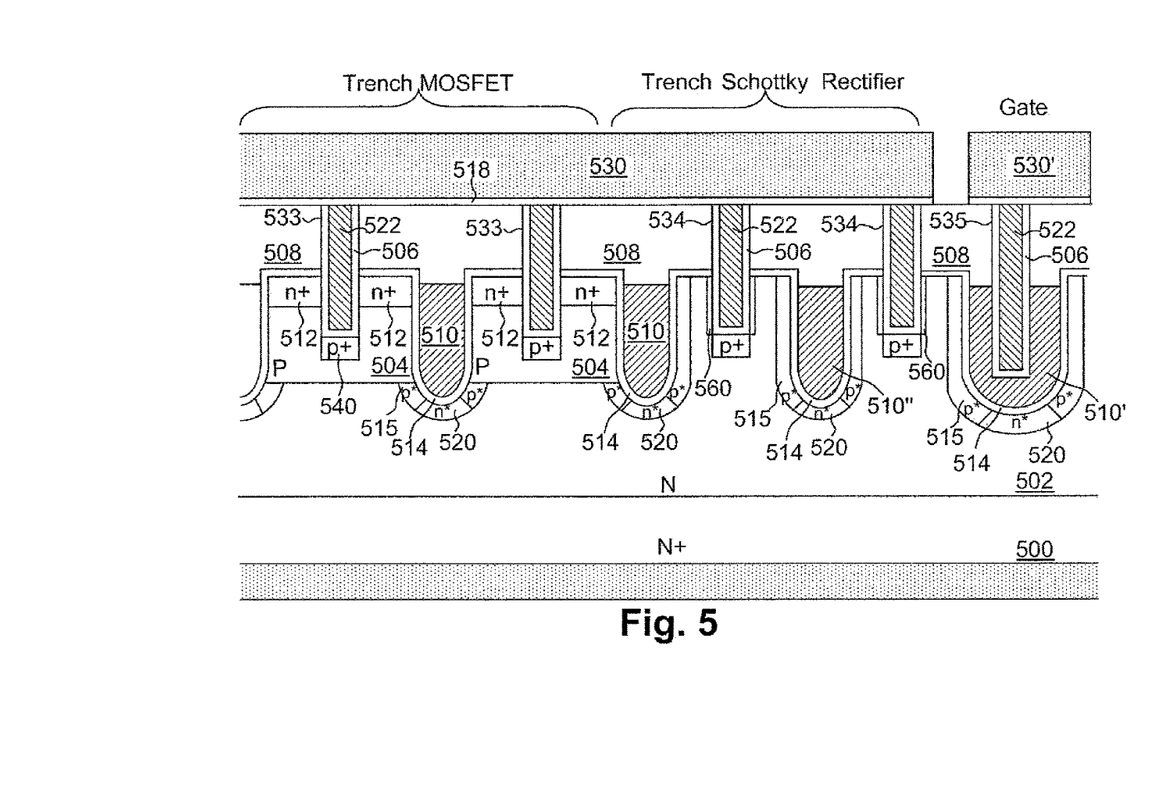
FIG. 5 is a side cross-sectional view of another preferred embodiment in accordance with the present invention.

Please refer to FIG. 5 for another preferred embodiment of the present invention which is built in an N epitaxial layer 502 onto an N+ semiconductor substrate 500. A plurality of first type trenched gates 510 in the trench MOSFET and a plurality of second type trenched gates 510" for the trench Schottky rectifier are formed in the N epitaxial layer 502 and filled with a doped poly-silicon layer padded by a gate oxide 514. Besides, a third type trenched gate 510' having a greater trench width than the other trenched gates for gate connection is also formed in the N epitaxial layer 502 and filled with the doped poly-silicon layer padded by the gate oxide 514. P body regions 504 are surrounding trench sidewalls of the first type trenched gates 510 with n+ source regions 512 near its top surface. Source-body contact trenches filled with contact metal plugs 522 padded by a barrier metal layer 506 are opened through an insulating layer 508, the n+ source regions 512 and extending into the P body regions 504. A plurality of Schottky contact trenches 534 filled with the contact metal plugs 522 padded by the barrier metal layer 506 are penetrating through the insulating layer 508 and extending into the N epitaxial layer 502. Besides, a gate contact trench 535 filled with the contact metal plug 522 padded by the barrier metal layer 506 is penetrating through the insulating layer 508 and extending into the doped poly-silicon layer in the third type trenched gate 510'. A p+ body contact region 540 are formed right below each the source-body contact trench 533 and each the Schottky contact trench 534 to reduce the contact resistance between the contact metal plugs 522 and the P body regions 504. A metal layer composed of Al alloys or Copper coated with a resistance-reduction layer 518 composed of Ti or Ti/TiN is deposited and patterned by a metal mask to form a source/anode metal 530 and a gate metal 530'. Specifically, the source/anode metal 530 connects the n+ source regions 512 and the P body regions 504 of the trench MOSFET with the anode of the trench Schottky rectifier, while the gate metal 530' is connected to the third type trenched gate, which means the second type trenched gates 510" in the trench Schottky rectifier is not shorted with the anode metal. For the purpose of reducing Qgd, trench sidewalls of the third type trenched gates 510' and the second type trenched gates 510" for the trench Schottky rectifier, and bottom portion of trench sidewalls of the first type trenched gates 510 for the trench MOSFET are surrounded by p* tilt-angle implanted body dopant regions 515 and the central portions underneath trench bottoms of all the trenched gates are formed with n* source dopant regions 520. The trench Schottky rectifier has a Schottky silicide barrier layer 560 formed along trench sidewalls of the Schottky contact trenches 534 in the N epitaxial layer 502.

Figure 6:
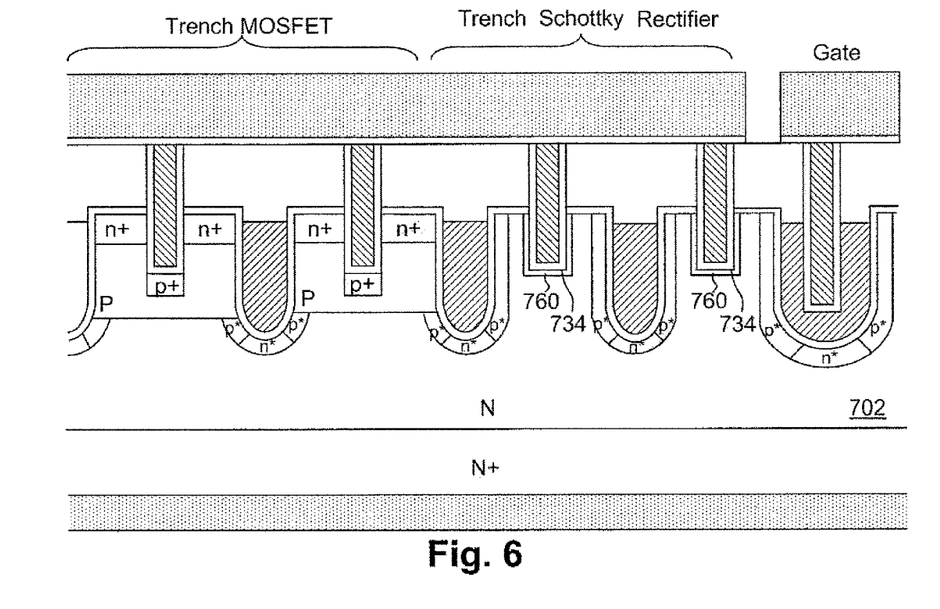
FIG. 6 is a side cross-sectional view of another preferred embodiment in accordance with the present invention.

FIG. 6 shows a side cross sectional view of another preferred embodiment of the present invention with a similar configuration to that of the integrated circuit shown in FIG. 5 except that, there is no the p+ body contact regions underneath the Schottky contact trenches 734 for the trench Schottky rectifier, which is implemented by using an additional p+ mask to block p+ Ion Implantation during fabricating process. The trench Schottky rectifier has a Schottky silicide barrier layer 760 formed along trench sidewalls and trench bottoms of the Schottky contact trenches 734 in the N epitaxial layer 702.

Figure 7A:
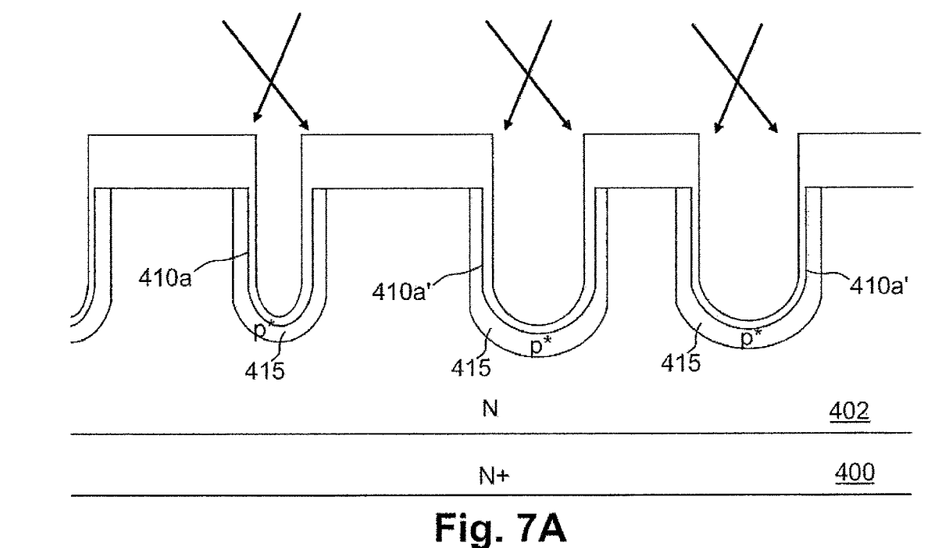
FIGS. 7A to 7E are a serial of side cross-sectional views for showing the processing steps for fabricating integrated trench MOSFET and trench Schottky rectifier in FIG. 4.

In FIG. 7A, an N doped epitaxial layer 402 is grown on an N+ semiconductor substrate 400, then, after a thick oxide deposition along top surface of the N epitaxial layer 402, a trench mask (not shown) is applied, which is then conventional exposed and patterned to leave mask portions. The patterned mask portions define the gate trenches 410a for the trench MOSFET and gate trenches 410' for the trench Schottky rectifier, which are dry oxide etched and dry silicon etched through mask opening to a certain depth. Next, a sacrificial oxide (not shown) is grown and then removed to eliminate the plasma damage may introduced during trenches etching process. After that, a screen oxide is grown for the followed Boron angle Ion Implantation to form p* tilt-angle implanted body dopant regions 415 wrapping trench sidewalls and trench bottoms of the gate trenches 410a and gate trenches 410a'.

Figure 7B:
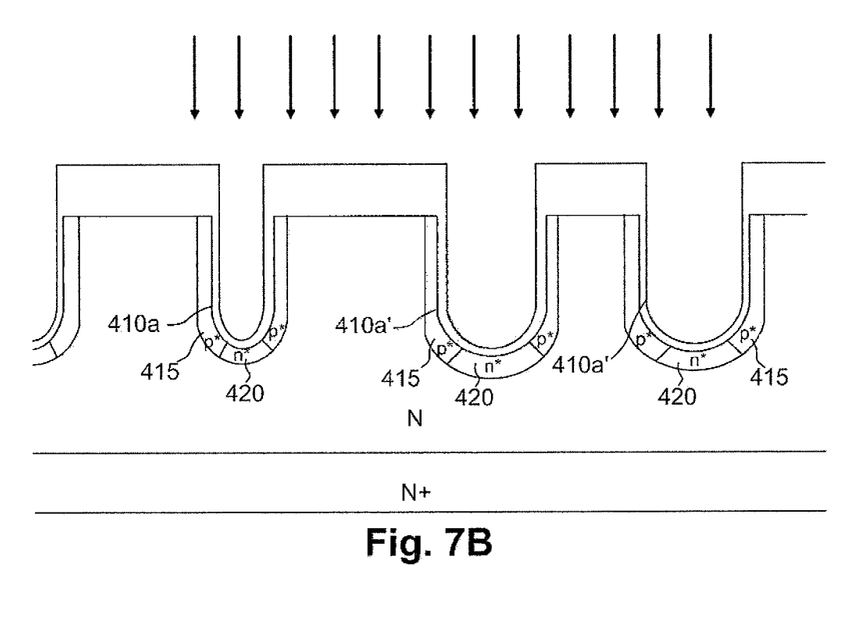
Figure 7C:
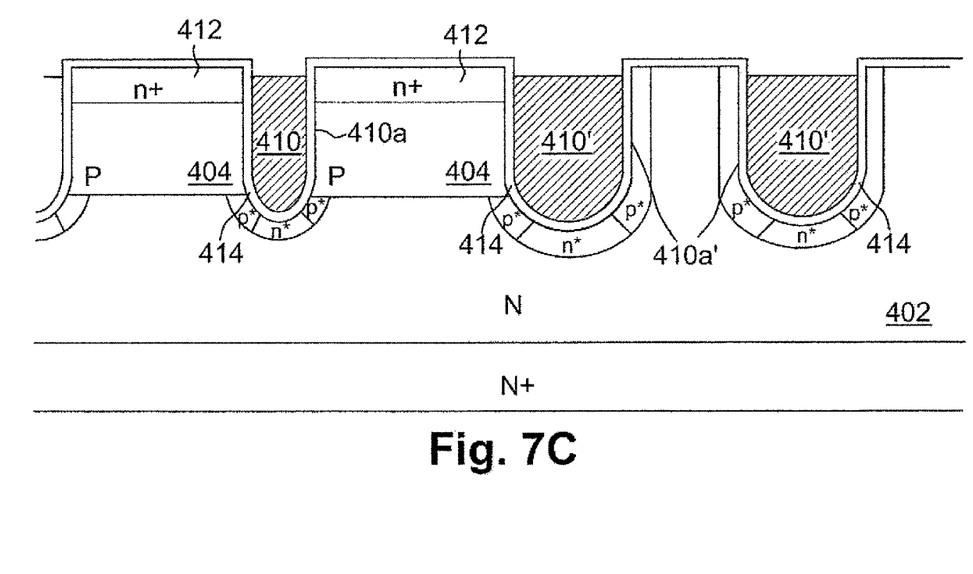
Figure 7D:
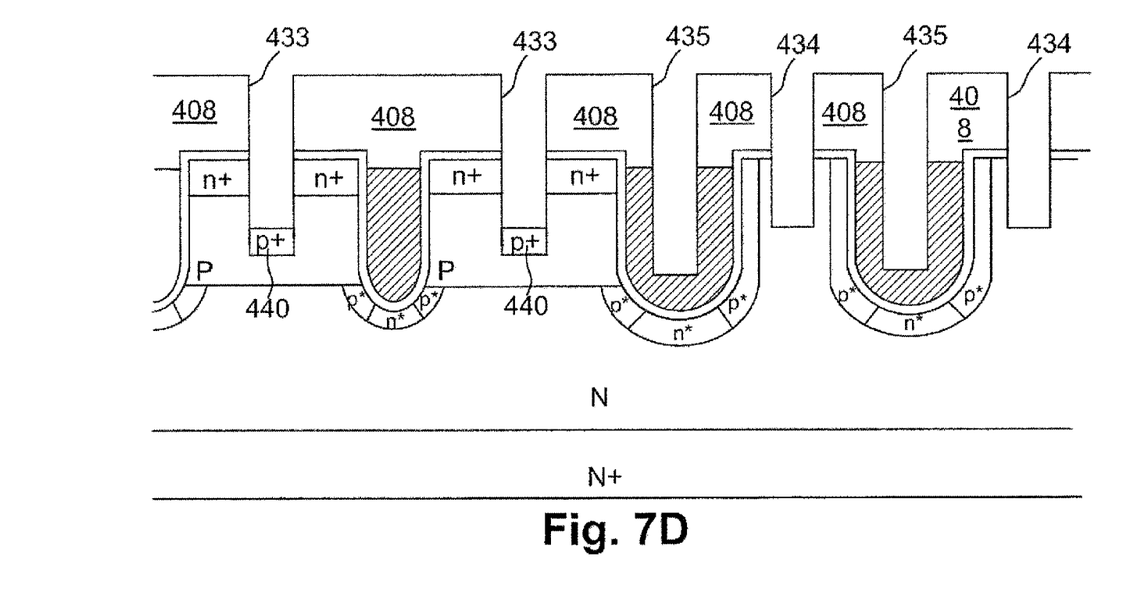
Figure 7E:
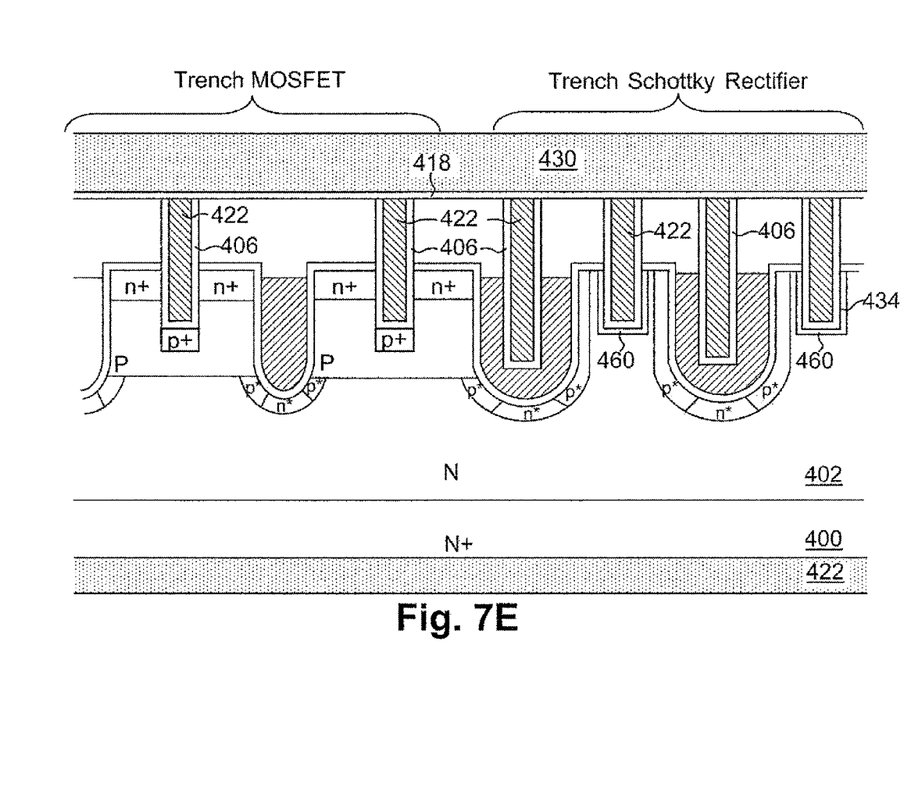

In FIG. 7B, another vertical Arsenic or Phosphorus Ion Implantation is carried out to form n* source dopant regions 420 right below the trench bottoms of the gate trenches 410a and the gate trenches 410a'. In FIG. 7C, the screen oxide is first removed and a gate oxide 414 is formed on the front surface of the N epitaxial layer 402 and inner surface of the gate trenches 410a and 410a'. Next, all the gate trenches are filled with conductive material, for example, a doped poly-silicon layer, to form a plurality of first type trenched gates 410 for the trench MOSFET and a plurality of second type trenched gates 410' for the trench Schottky rectifier. Then, the filling-in conductive material is etched back or CMP (Chemical Mechanical Polishing) to expose the portion of the gate oxide 414 that extends over top surface of the N epitaxial layer 402. Next, by employing a P body mask, an Ion Implantation is applied to form P body regions 404 only in the trench MOSFET, followed by a P body diffusion step for the P body regions drive in. After removing the P body mask, another Ion Implantation is applied to form n+ source regions 412 using a source mask followed by an n+ diffusion step for the n+ source regions drive in. Then, in FIG. 7D, an insulating layer 408, for example a thick oxide layer, is formed over whole top surface, through which a plurality of contact trenches are etched by forming a contact mask (not shown) by successive dry oxide etching and dry silicon etching, wherein the contact trenches include a plurality of source-body contact trenches 433, a plurality of Schottky contact trenches 434 and a plurality of gate contact trenches 435. Next, a BF2 Ion Implantation is applied over the contact mask to form p+ body contact regions 440 wrapping trench bottoms of the source-body contact trenches 433 in the trench MOSFET to further reduce contact resistance. In FIG. 7E, after the deposition of Ti/TiN or Co/TiN to act as a barrier metal layer 406, a step of RTA (Rapid Thermal Annealing) under 730~900° C. for 30 seconds is carried out for the formation of $TiSi_2$ or CoSi2. Therefore, the Schottky silicide barrier layer 460 is formed along trench sidewalls and trench bottoms of the Schottky contact trenches 434 in the N epitaxial layer 402. Then, all the contact trenches are filled with tungsten metal to form contact metal plugs 422. After the Ti/TiN/W or Co/TiN/W etching back, a Al Alloys or Copper metal layer is deposited over a resistance-reduction layer 418 composed of a low resistance metal layer such as a Ti or Ti/TiN layer to serve as a source/anode metal 430. Last, a drain metal 422 composed of Ti/Ni/Ag is then deposited on rear surface of the N+ semiconductor substrate 400 after backside grinding.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. An integrated circuit comprising a trench MOSFET and a trench Schottky rectifier further comprising:
    a semiconductor substrate of a first conductivity doping type;
    an epitaxial layer of said first conductivity doping type over said semiconductor substrate, wherein said epitaxial layer having a lower doping concentration than said semiconductor substrate;
    said trench MOSFET comprising a plurality of first type trenched gates surrounded by source regions of said first conductivity doping type encompassed in body regions of a second conductivity doping type above a drain region disposed on a bottom surface of said semiconductor substrate, and further comprising:
        a plurality of tilt-angle implanted body dopant regions surrounding a lower portion of trench sidewalls of said first type trenched gates for reducing Qgd;

a plurality of source dopant regions disposed below trench bottom of said first type trenched gates and adjacent to said tilt-angle implanted body dopant regions for functioning as a current path between said drain region to said source regions for preventing a resistance increase caused by said tilt-angle implanted body dopant regions surrounding said lower portions of said trench sidewalls of said first type trenched gates;

an insulating layer covering said integrated circuit with a source-body contact trench opened in said trench MOSFET through said source regions and extended into said body regions and filled with a contact metal plug overlying a barrier metal layer therein wherein said contact metal plug filled in said source-body contact trench being connected with a source metal;

said trench Schottky rectifier with a plurality of Schottky contact trenches formed into said epitaxial layer and between adjacent second type trenched gates in a different area from said trench MOSFET and having a Schottky silicide barrier layer formed at least along trench sidewalls of said Schottky contact trenches penetrating through said insulating layer and extending into said epitaxial layer filled with said contact metal plug overlying said barrier metal layer directly contacting trench bottoms and said trench sidewalls of said Schottky contact trenches, wherein said source regions and said body regions not exist between said adjacent second type trenched gates in said trench Schottky rectifier, and said contact metal plug filled into said Schottky contact trenches being connected with an anode metal;

said second type trenched gates in said Schottky rectifier surrounded with said tilt-angle implanted body dopant region along trench sidewalls and with said source dopant regions below trench bottoms of said second type trenched gates;

said first type trenched gates in said trench MOSFET and said second type trenched gates in said trench Schottky rectifier comprising a conductive material surrounded with a gate oxide and said second type trenched gates having a greater trench depth than said Schottky contact trenches into said epitaxial layer;

said Schottky rectifier formed at least along said trench sidewalls of said Schottky contact trenches in said epitaxial layer, separated from said conductive material filled in said pair of adjacent second type trenched gates by said epitaxial layer, said tilt-angle implanted body dopant regions and said gate oxide without having said source regions and said body regions surrounding said trench sidewalls of said Schottky contact trenches; and said source metal and said anode metal being connected together as a source/anode metal.

2. The integrated circuit of claim 1 wherein said first type trenched gates of said trench MOSFET are separated from said second type trenched gates of said trench Schottky rectifier which are shorted with said anode metal of said trench Schottky rectifier.

3. The integrated circuit of claim 1 wherein said first type trenched gates of said trench MOSFET and said second type trenched gates of said trench Schottky rectifier are connected together.

4. The integrated circuit of claim 1 wherein said gate oxide is single gate oxide.

5. The integrated circuit of claim 1 wherein said barrier metal layer lining in said source-body contact trench and said Schottky contact trenches is Ti/TiN or Co/TiN.

6. The integrated circuit of claim 1 wherein said contact metal plugs overlying said barrier metal layers is tungsten.

7. The integrated circuit of claim 1 wherein said Schottky silicide barrier layer comprises $TiSi_2$ (Ti Silicide) or $CoSi_2$ (Co Silicide).

8. The integrated circuit of claim 1 wherein said source/anode metal is Ti/Aluminum alloys, Ti/TiN/Aluminum alloys, or Ti/TiN/Copper.

9. The integrated circuit of claim 1 wherein said Schottky silicide barrier layer lines along said trench sidewalls and trench bottoms of said Schottky contact trenches, or only along said trench sidewalk of said Schottky contact trenches.

* * * * *